United States Patent
Ohno et al.

(10) Patent No.: US 6,373,082 B1
(45) Date of Patent: Apr. 16, 2002

(54) COMPOUND SEMICONDUCTOR FIELD EFFECT TRANSISTOR

(75) Inventors: Yasuo Ohno; Yuji Takahashi; Kazuaki Kunihiro, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/205,707

(22) Filed: Dec. 4, 1998

(30) Foreign Application Priority Data

Dec. 4, 1997 (JP) ............................................... 9-334585

(51) Int. Cl.[7] ....................... H01L 31/119; H01L 23/58; H01L 27/10; H01L 29/768; H01L 31/117
(52) U.S. Cl. ...................... 257/287; 257/401; 257/487; 257/206; 257/220; 257/287; 257/286
(58) Field of Search .................................. 257/401, 487, 257/206, 220, 287, 286, 221, 224, 329, 263, 240, 241, 244, 324, 103

(56) References Cited

U.S. PATENT DOCUMENTS 5,493,136 A * 2/1996 Matsuzaki et al. .......... 257/287

FOREIGN PATENT DOCUMENTS

JP             404368179 A  * 12/1992

* cited by examiner

Primary Examiner—Carl Whitehead, Jr.
Assistant Examiner—James Mitchell
(74) Attorney, Agent, or Firm—McGinn & Gibb, PLLC

(57) ABSTRACT

A compound semiconductor field effect transistor having, between a gate electrode and a drain electrode, a non-gate region which is the channel region not covered by the gate electrode, wherein a plurality of isolation regions are formed in the non-gate region in such a way that they extend in the direction of channel current and contact with the gate electrode. This compound semiconductor field effect transistor is improved in breakdown voltage between drain and gate and yet retains the high-speed operability of transistor.

16 Claims, 6 Drawing Sheets

COMPOUND SEMICONDUCTOR FIELD EFFECT TRANSISTOR

BACKGROUND OF THE INVENTION

1. Field of the Invention

The present invention relates to the structure of a compound semiconductor field effect transistor, particularly such a transistor having a high breakdown voltage.

2. Description of the Related Art

In power compound semiconductor FET's (FET stands for field effect transistor) having a high breakdown voltage, a portion of the channel region not covered by the gate electrode, i.e. a non-gate region is formed between the gate electrode and the drain electrode for higher breakdown voltage of drain. Thereby, when a voltage is applied to the drain electrode, depletion occurs in the non-gate region, electric field concentration is prevented, and direct short-circuiting between gate electrode and drain electrode is prevented.

It was found, however, that when a high voltage is applied and an electric current flows through the channel region, there appears a phenomenon that avalanche breakdown takes place and generates holes and the holes flow toward the vicinity of the gate electrode according to the electric field generated, allowing the surface to be positively charged and making the channel more conductive. The mechanism of the phenomenon is shown in FIG. 3. In FIG. 3, 12 is a semi-insulating substrate; 1 is a source electrode; 2 is a gate electrode; 3 is a channel; 4 is a drain electrode; 8 is an electron flow of channel current (a channel electron flow); 9 is an electron flow generated by avalanche breakdown (an avalanche electron flow); 10 is a hole flow generated by avalanche breakdown (an avalanche hole flow); 11 is a surface state of non-gate region; and 26 is a depletion region.

In order to increase the breakdown voltage between drain electrode and gate electrode, it is necessary that the holes generated by avalanche breakdown are allowed not to reach the channel surface of transistor, particularly the vicinity of the gate electrode or that the generation per se of holes is suppressed.

SUMMARY OF THE INVENTION

The present invention lies in a compound semiconductor field effect transistor having, between a gate electrode and a drain electrode, a non-gate region which is the channel region not covered by the gate electrode, wherein a plurality of isolation regions are formed in the non-gate region in such a way that they extend in the direction of channel current (channel direction) and contact with the gate electrode.

The present invention lies in A compound semiconductor field effect transistor having, between a gate electrode and a drain electrode, a non-gate region which is the channel region not covered by the gate electrode, wherein a plurality of isolation regions are formed in the non-gate region in such a way that they extend in the direction of channel current (channel direction) and contact with the gate electrode.

In the compound semiconductor field effect transistor of the present invention, the breakdown voltage between drain and gate can be increased without substantially inviting an increase in parasitic capacity and a decrease in speed.

Further, the compound semiconductor field effect transistor of the present invention, when having no p type layer, can be produced easily because preparation of a new mask is an only step to be added and no use of any new complicated step is needed.

DETAILED DESCRIPTION OF THE PREFERRED EMBODIMENTS

Figure 1:
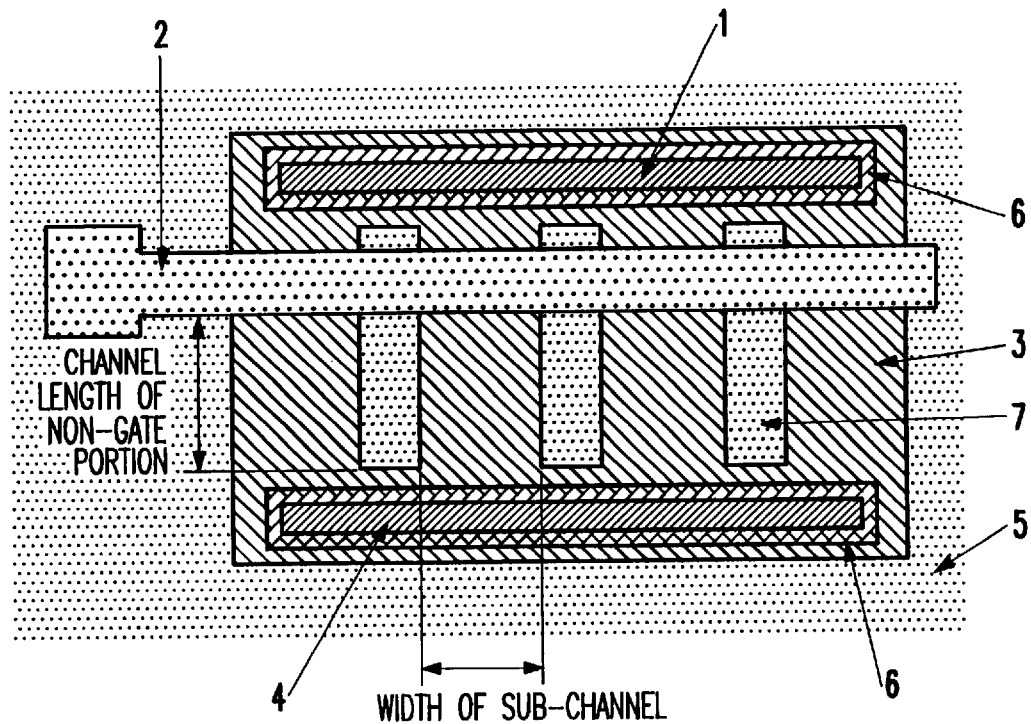
FIG. 1 is a schematic plan view of the first embodiment of the compound semiconductor field effect transistor of the present invention.

As previously mentioned, in power compound semiconductor FET's having a high breakdown voltage, when a high voltage is applied and an electric current flows through the channel region, avalanche breakdown takes place and generates holes; the holes flow to the vicinity of the gate electrode according to the electric field generated, allowing the surface state to be positively charged and making the channel region more conductive; as a result, the breakdown voltage of FET decreases. This phenomenon can be prevented by minimizing the approach of the avalanche-generated holes to the surface of the vicinity of gate. However, the electric field of current direction is formed so as to attract the holes toward the gate.

Hence, it is considered to allow the holes to flow parallel to the gate so as not to approach the gate. Each end of channel, i.e. each portion of channel interfacing with each isolation region has a positive voltage while each isolation region has a lower voltage, and there exists such an electric field that the holes are attracted into each isolation region. Therefore, the holes present near the end of channel are attracted X from the channel. Particularly when the isolation region is a semi-insulating hole-trapping type region or a p type region, the voltage of the isolation region is nearly identical to the voltage of gate and efficient hole attraction is possible. In order to increase the areal proportion of the end portion, it is advisable to form isolation regions in the non-gate region and thereby form a plurality of rectangular channel regions (sub-channel) (see FIG. 1). Since a near-depletion state appears under a drain bias in which breakdown voltage becomes a problem, the width of channel end portion where hole attraction is possible (i.e. the width of the portion of sub-channel extending from the isolation-region/sub-channel interface toward the width direction of sub-channel where hole attraction is possible), is determined by the shape of non-gate portion. That is, an electric field parallel to the gate lengthwise direction is formed which is effective over the channel length of non-gate portion in each sub-channel region. By making the width of sub-channel about equal to the channel length of non-gate portion, an unnecessary increase in transistor area can be prevented while the effect of hole attraction into a direction parallel to the gate lengthwise direction is maintained.

The isolation regions are formed ordinarily by converting conductive regions into semi-insulating regions by boron ion implantation or the like. They preferably are semi-insulating hole-trapping type regions.

The above-mentioned isolation regions have high resistance and therefore give rise to a reduction in potential even when a low level of hole flow appears, which may weaken the electric field in which holes are attracted. To prevent this, it is advisable to extend the gate metal into the isolation regions to shorten the length of each high-resistance region (see FIG. 8).

When the isolation regions are formed as p type regions (see FIG. 9), there is obtained a merit that the conductivity of hole is significantly increased and yet the isolation of channel can be maintained by the backward bias of pn junction.

By gradually changing the width of each rectangular sub-channel in non-gate region, over a distance from the gate to the drain (see FIGS. 6 and 7), the conductivity in current direction is changed, whereby the position and extent of electric field concentration can be controlled. When the surface has a surface state of hole-trapping type, electric field concentration takes place at the end of each channel close to the drain; therefore, the maximum electric field can be lowered by widening the width of channel at the drain side. When the surface has a surface state of electron-trapping type, electric field concentration takes place at the end of each channel close to the gate; therefore, the maximum electric field can be lowered by widening the width of channel at the gate side.

Since these structures result in reduction in effective gate width, a wider channel is required in order to obtain the same current level. However, the enlarged area is fundamentally a semi-insulating isolation region and invites no substantial increase in gate capacity; therefore, there occurs no reduction in high speed operability.

First Embodiment

Figure 2:
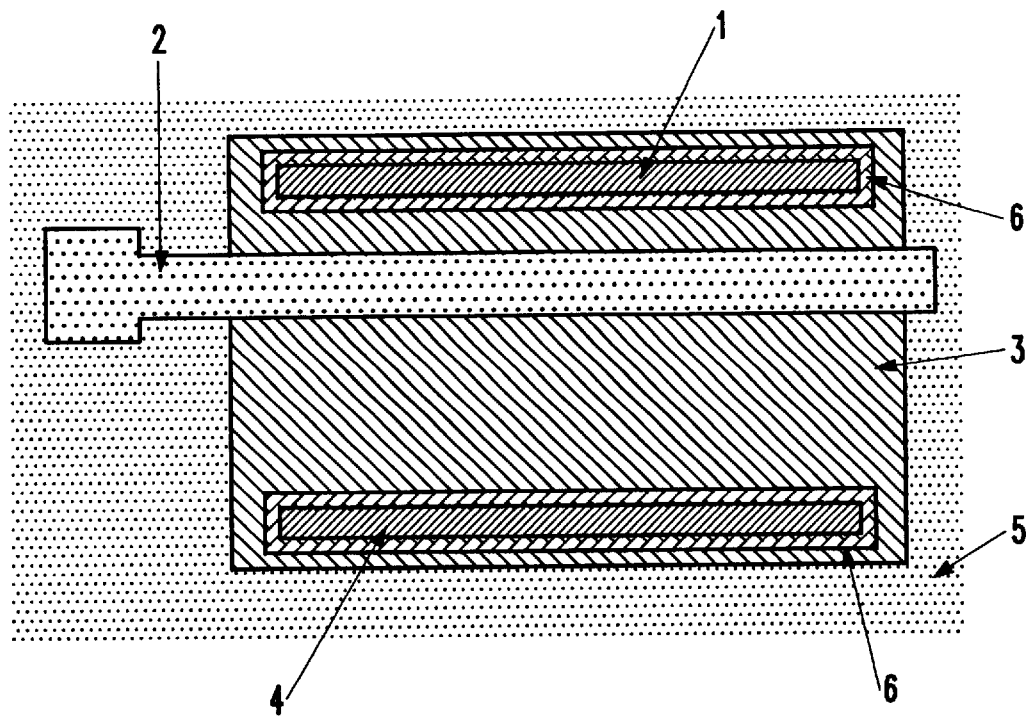
FIG. 2 is a schematic plan view of a conventional compound semiconductor field effect transistor.

FIG. 1 is a schematic plan view of one embodiment of the compound semiconductor field effect transistor according to the present invention. In FIG. 1, 1 is a source electrode; 2 is a gate electrode; 3 is a channel; 4 is a drain electrode; 5 is an insulating region at the circumference of transistor; 6 is a highly doped n type region (an electrode n+ region) surrounding the source electrode or the drain electrode; and 7 is isolation regions employed in the present invention. FIG. 2 is a schematic plan view of a conventional field effect transistor.

In FIG. 2, there is, between a gate electrode 2 and a drain electrode 4, a region not covered by the gate metal (i.e. a non-gate region). This non-gate region has a uniform structure in a gate width direction (a gate lengthwise direction). Meanwhile, in the non-gate region of FIG. 1, are formed isolation regions 7 at given intervals so as to cross the gate electrode 2.

Figure 3:
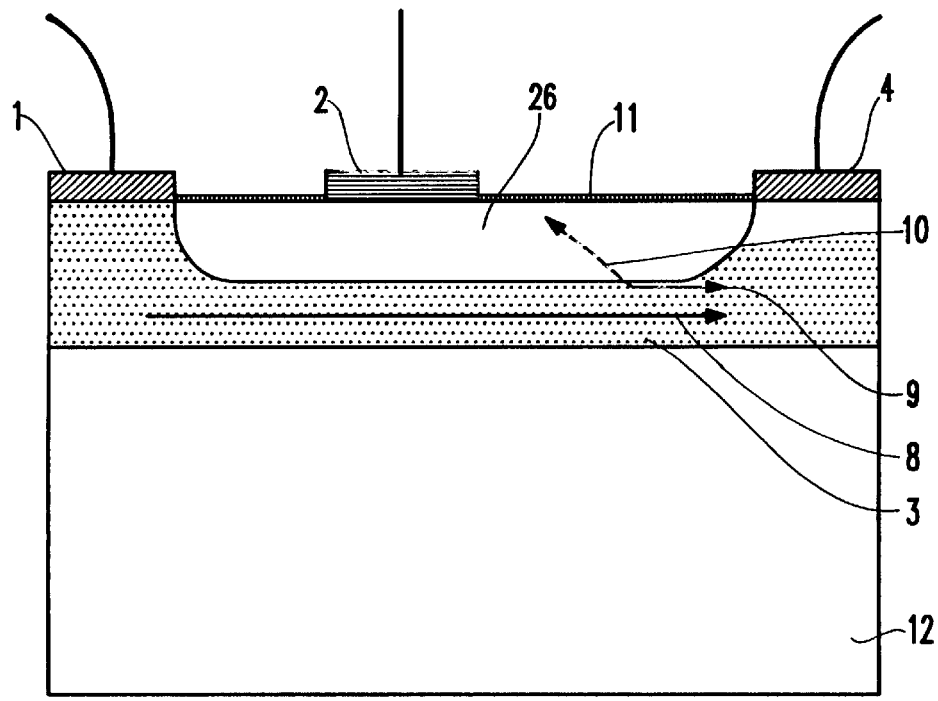
FIG. 3 is a drawing explaining a mechanism in which breakdown takes place in a high breakdown voltage field effect transistor between the drain and the gate.

As mentioned previously, in a power FET, avalanche breakdown takes place in the vicinity of the drain owing to a high electric field and generates holes, and the holes flow to a lower-voltage direction according to the electric field generated. Explaining in FIG. 3, part of the holes generated in a channel 3 flows to a substrate side; and the remainder flows first to the surface and then to a gate electrode 2 of lower potential, and these holes allow the surface near the gate to be positively charged and invite an increase in drain current. This is a basic mechanism of voltage breakdown. Incidentally, in FIG. 3, 26 is a depleted region and the impurity concentration therein is the same as in the channel 3.

Figure 4:
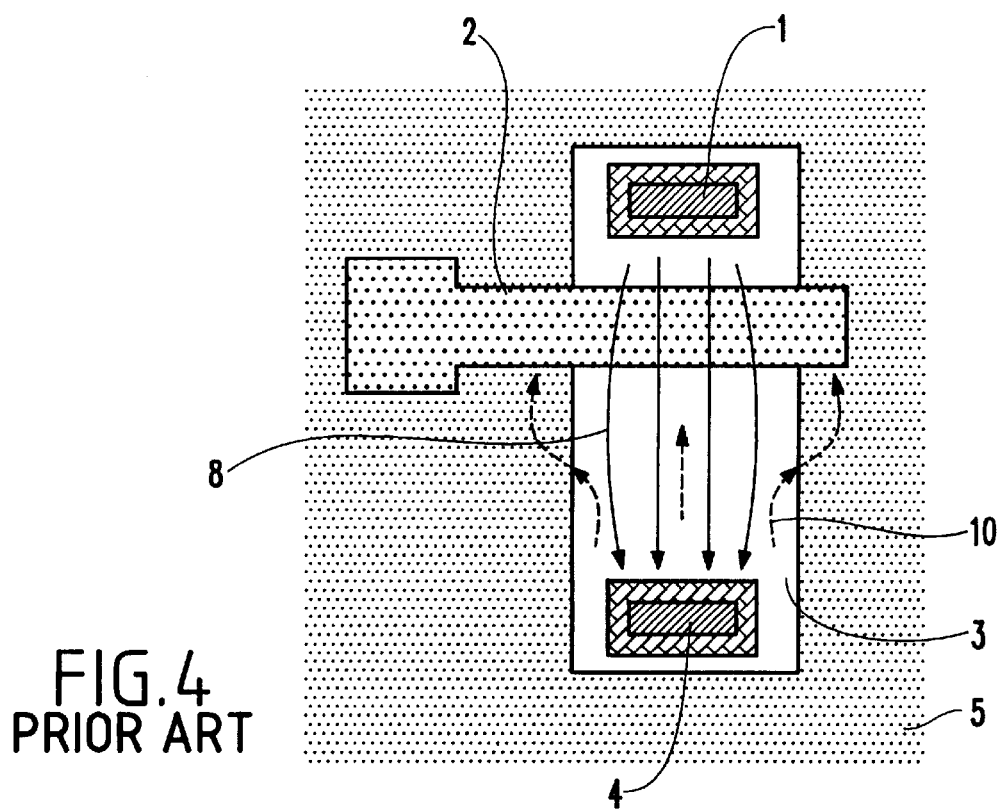
FIG. 4 is a drawing showing an electric current flowing in a conventional field effect transistor during its operation.

In general, the semi-insulating isolation region (corresponding to the insulating region 5) formed in compound semiconductors is often fixed at a voltage close to the potential of gate owing to a trapping effect. Therefore, as shown in FIG. 4, the avalanche hole flow 10 generating in a channel 3 proceeds, at the end portion of the channel, toward the channel end (channel/insulating region interface), and part of the flow enters a gate electrode 2 via an insulating region 5. As a result, the hole concentration at the channel end portion tends to become lower.

Figure 5:
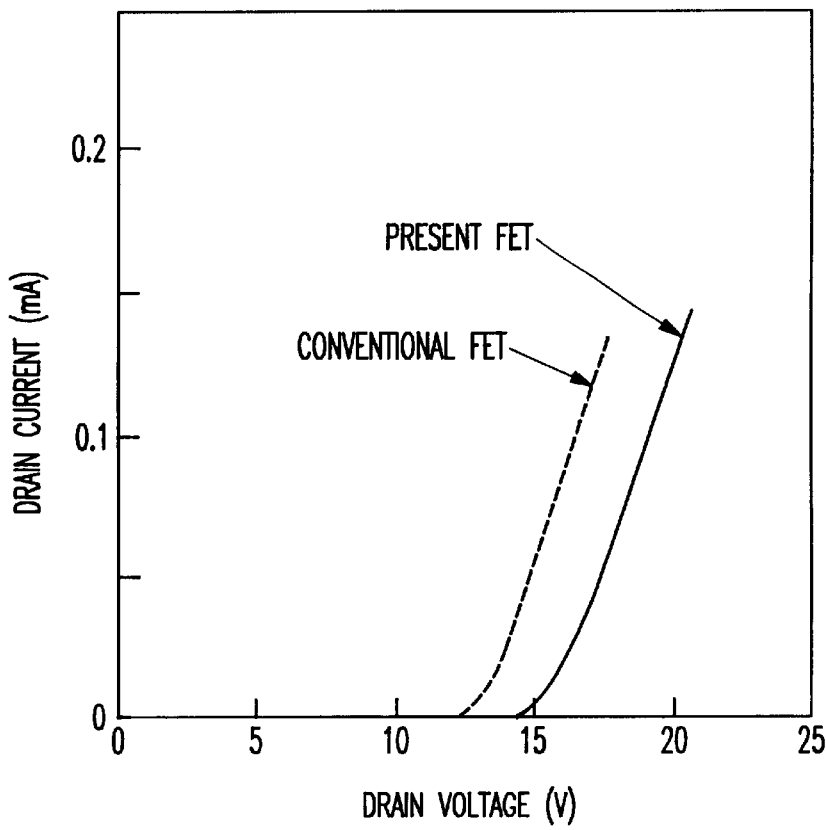
FIG. 5 is a drawing showing the current-voltage relations of the present field effect transistor and a conventional field effect transistor in their off-states.

FIG. 5 is a drawing showing the current-voltage relations of the present FET and a conventional FET and indicates a change of drain leakage current relative to drain voltage, of FET when the gate electrode is set at –5V and the FET is in an off-state. The FET of conventional structure had a channel region having a width of 100 $\mu$m and the present FET had 20 stripe-shaped sub-channels each having a width of 5 $\mu$m. As shown in FIG. 5, an electric current begins to flow at about 13 V in the FET of conventional structure while an electric current begins to flow at a higher voltage (about 15 V) in the present FET.

Second Embodiment

Figure 6:
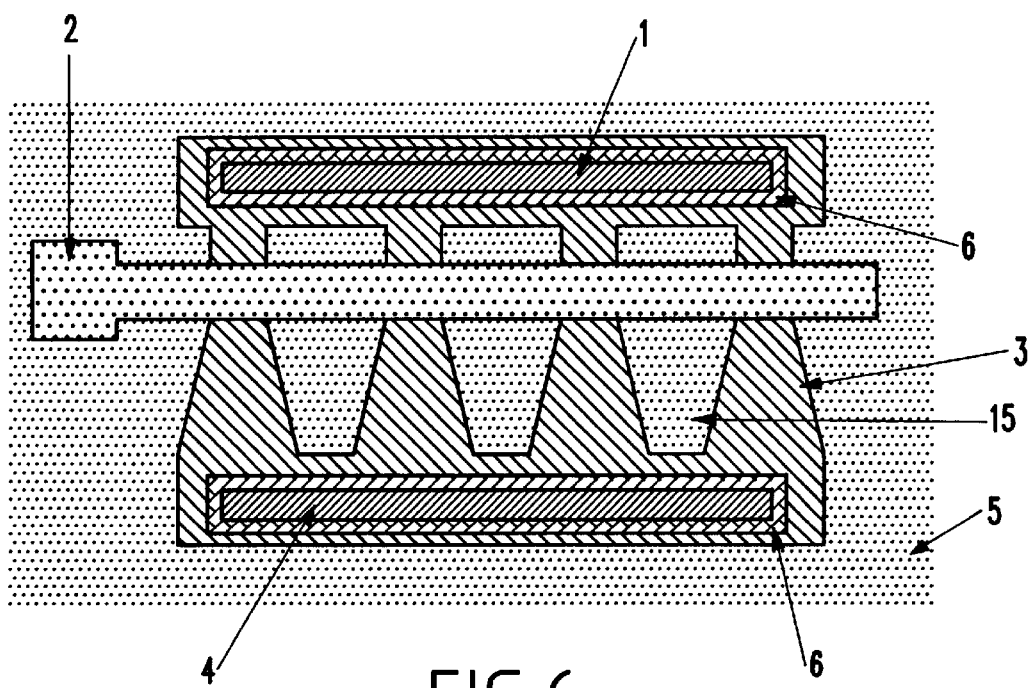
FIG. 6 is a schematic plan view of the second embodiment of the compound semiconductor field effect transistor of the present invention.

To reduce hole concentration, it is also effective to suppress the generation of holes. Since the generation of holes is caused by avalanche breakdown, it is necessary for suppression of hole generation to reduce the peak electric field in channel at the same mean-electric field. When the surface has a hole-trapping type surface state, electric field concentration occurs at an area of the channel near the drain; by employing a structure as shown in FIG. 6 in which the width of each non-gate region of channel sandwiched between two isolation regions 15 is gradually increased from the gate toward the drain, the resistance of the channel in the vicinity of the gate increases, the electric field in the vicinity of the gate is enhanced, and the electric field in the vicinity of the drain decreases. When the peak electric field is in the vicinity of the drain, the peak electric field is decreased and the generation of holes is suppressed.

Third Embodiment

Figure 7:
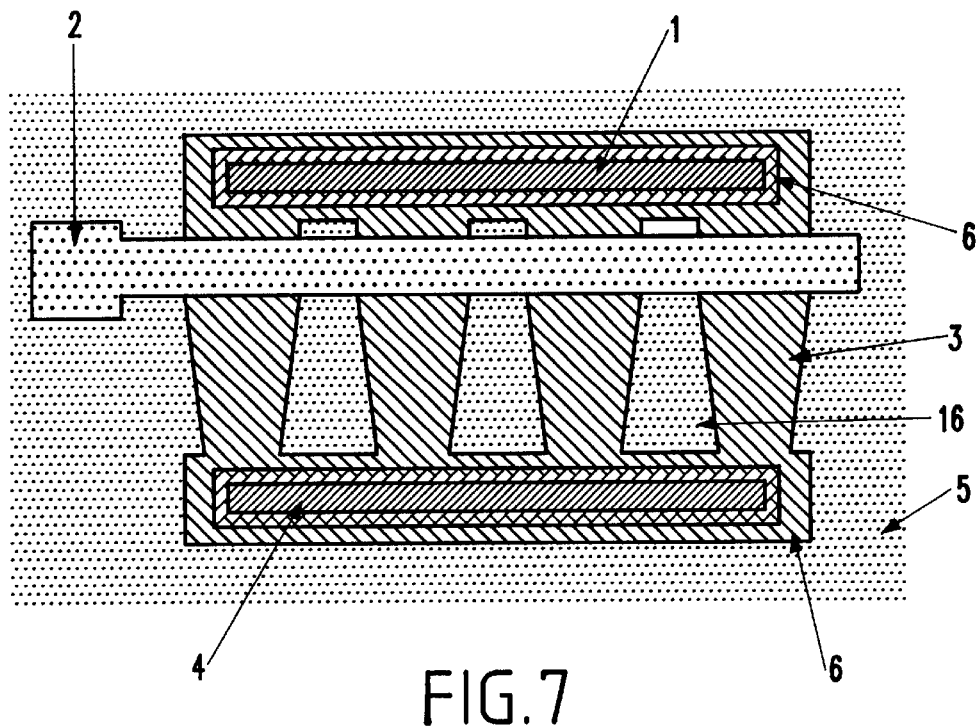
FIG. 7 is a schematic plan view of the third embodiment of the compound semiconductor field effect transistor of the present invention.

It is not easy to actually control the surface properties. There is a fear that the surface becomes an electron-trapping type depending upon the film quality, film growth method or surface treatment employed. When the surface has become an electron-trapping type, electric field concentration occurs at an area of the channel near the gate. It can be prevented by employing a structure as shown in FIG. 7 in which the width of each non-gate region of channel sandwiched between two isolation regions 15 is gradually decreased from the gate toward the drain. The principle of this structure is the same as in the second embodiment shown in FIG. 6.

Which of the second embodiment and the third embodiment is superior, differs by the production process of transistor; therefore, it is necessary to actually produce the second and third embodiments and compare them empirically. The second and third embodiments, when employed appropriately, show clear merits over the first embodiment wherein each isolation region has a simple rectangular shape.

Fourth Embodiment

Figure 8:
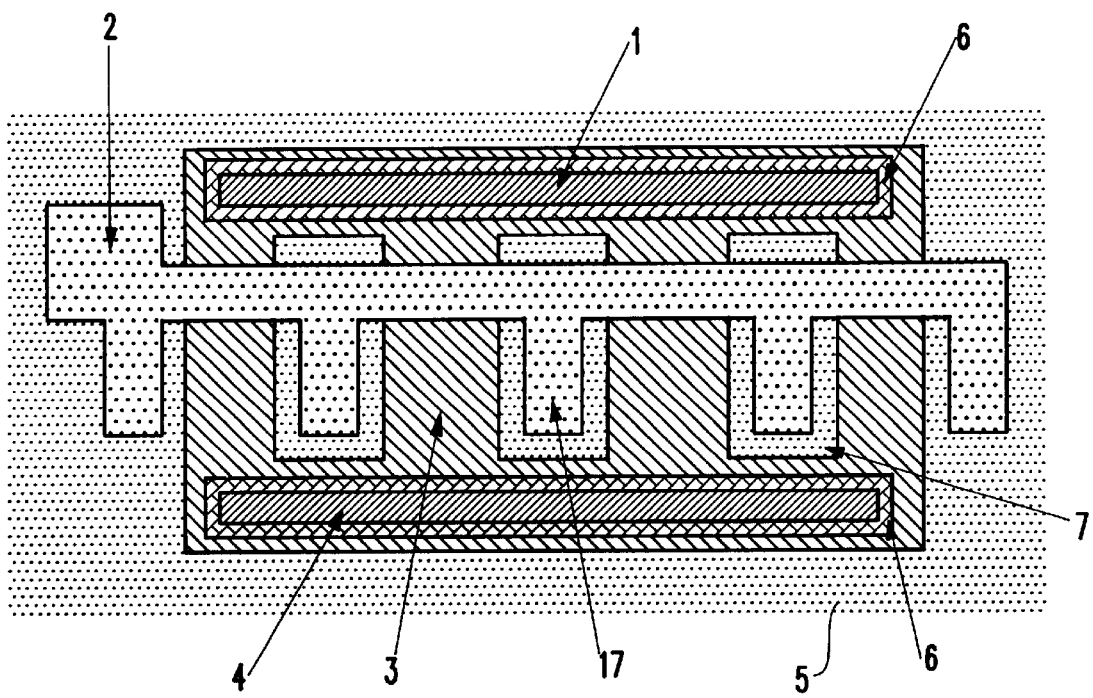
FIG. 8 is a schematic plan view of the fourth embodiment of the compound semiconductor field effect transistor of the present invention.

In the above first to third embodiments of FET, the holes which have entered the isolation regions, reach the gate electrode. Since the flow of holes (which determines the breakdown voltage of FET) is at a fairly low level, the first to third embodiments have certain merits as they are. In these embodiments, however, since there is a potential gradient in the isolation regions, the electric field parallel to gate, in channel end portion (which serves to attract holes) may be weak. Shown in FIG. 8 is a structure for dealing with the problem, in which the gate electrode projects into each isolation region. In this structure, each gate projection made of a metal makes smaller the width of each isolation region present between the gate projection and the channel and, moreover, the gate projection is extended as far as the vicinity of the drain (where avalanche occurs easily) for attraction of holes. Since the potential difference between gate and drain or between gate and channel is large and the electric field is strong in the vicinity of the drain, a minimum allowable distance must be secured between the gate projection and the drain so that no voltage breakdown takes place. In this embodiment, although the area of gate increases, the increase is on the isolation regions, making very small the reduction in speed caused by increase in capacity.

Fifth Embodiment

Figure 9:
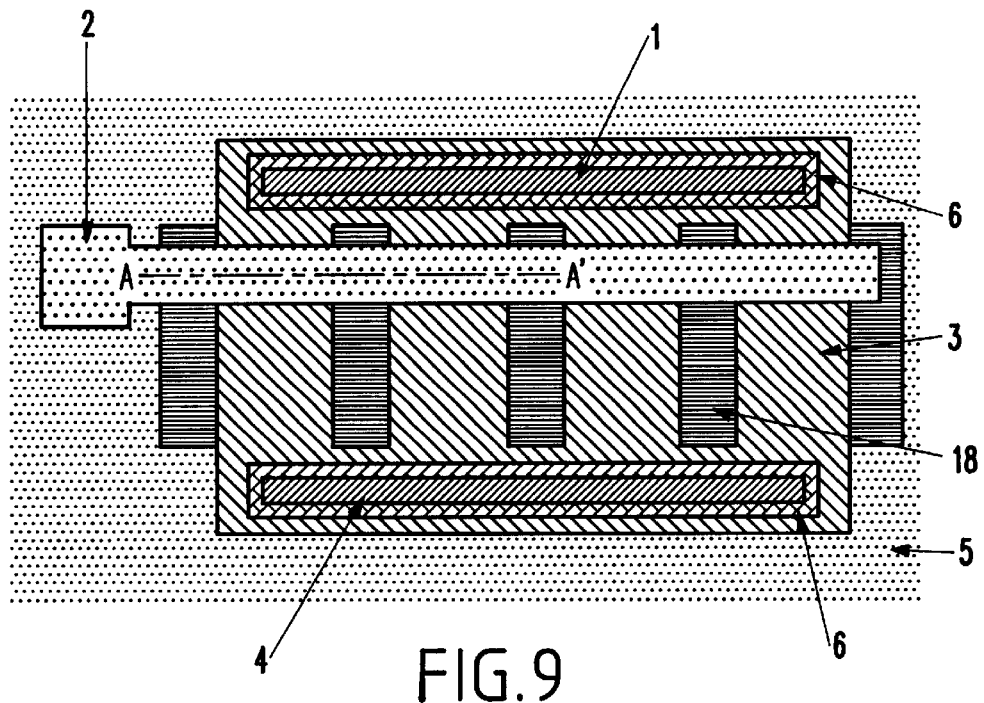
FIG. 9 is a schematic plan view of the fifth embodiment of the compound semiconductor field effect transistor of the present invention.

In FIG. 9 is shown a schematic plan view of a FET in which p type regions 18 are formed as the isolation regions 7 of the first embodiment. By forming p type regions, the flow of holes in the regions can be made smooth. The FET of the present invention is intended for use in a high voltage state, so formation of p type regions too high in dopant concentration causes insulation breakdown because the width of the depleted layer is small; however, when the p type regions are formed so as to contain an appropriate concentration of a dopant, as compared with when the isolation regions are semi-insulating regions, the p type regions have a far lower resistance, enabling efficient hole attraction and the resultant FET (the fifth embodiment) can have a sufficient breakdown voltage.

The p type regions can be formed by implantation of selected ion such as Be ion or the like.

Sixth Embodiment

Figure 10:
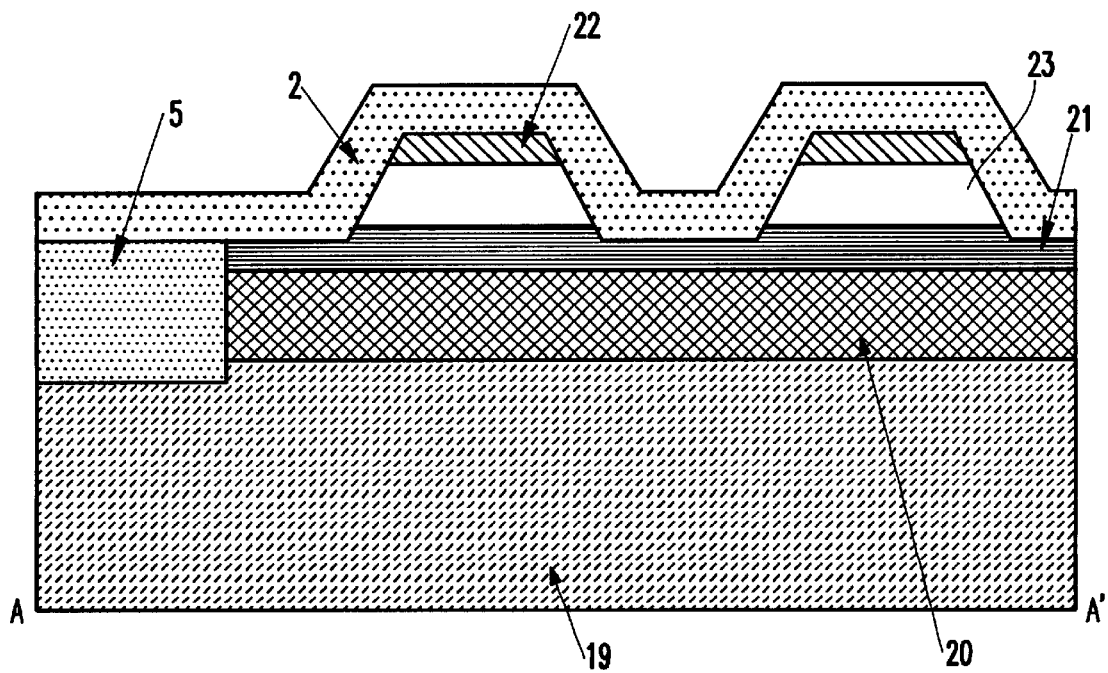
FIG. 10 is a schematic plan view of the sixth embodiment of the compound semiconductor field effect transistor of the present invention.

FIG. 10 is a schematic sectional view of a sixth embodiment FET using only epitaxial growth layers (epitaxial layers) (the view corresponds to a sectional view taken along the A–A' line of FIG. 9). The sixth embodiment is applied to a FET wherein a p type layer is formed below the channel. Such a structure is used for the increase of breakdown voltage or prevention of frequency scattering in power FET, and the use of only epitaxial layers is generally employed because it gives a semiconductor device of excellent properties. In the present embodiment, p type layers 18 (to become isolation regions) are formed by removing the n type layer by etching, to expose the surface of the p type layer, injecting ion (e.g. boron ion) into the insulating region 5 alone, and not injecting the ion into the p type layer other than the area just below the channel, to utilize as a p type layer.

The above structure can absorb even the holes flowing to the substrate side and therefore is effective also for prevention of so-called kink effect. Since the p type layer acts synchronously with the gate, increase in parasitic capacity becomes a problem between the p type layer and the substrate or the channel and not between the gate and the p type layer. Between the p type layer and the substrate, the problem is small because the p type layer is on the semi-insulating substrate. Between the p type layer and the channel, a large capacity arises particularly at the lower part of the channel; however, since this capacity controls the charges of the channel and the width of channel can be regarded to be two times when the lower part (back side) of the channel is considered in addition to the surface side, no reduction in speed takes place and the flow amount of electric current per unit gate width can be increased.

Seventh Embodiment

Figure 11:
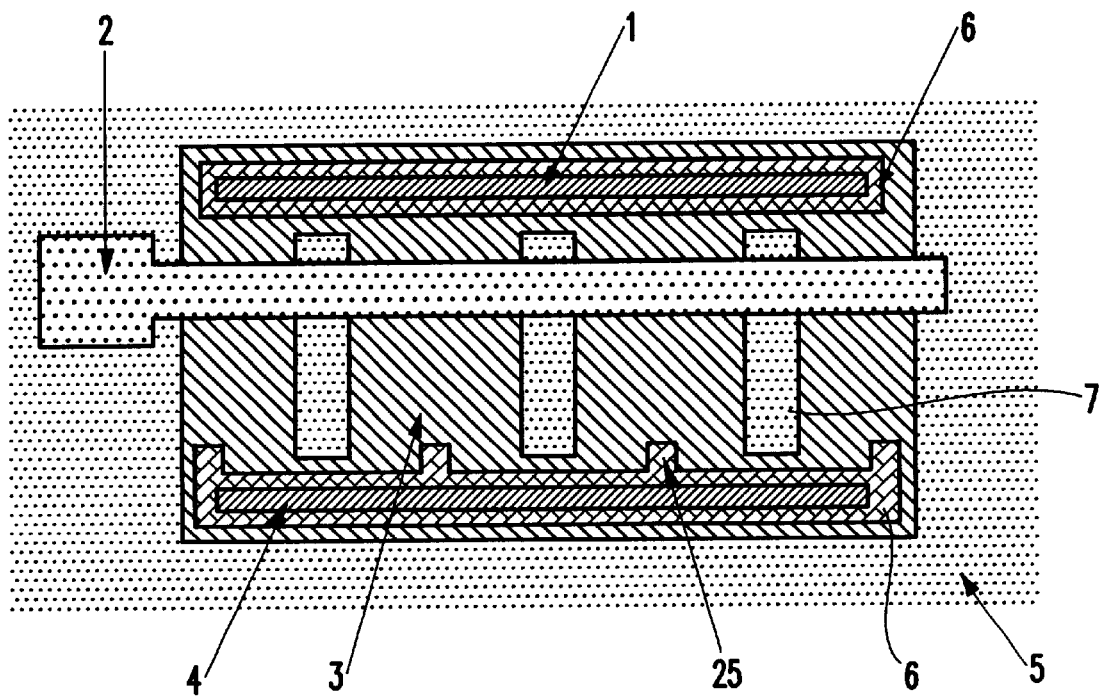
FIG. 11 is a schematic plan view of the seventh embodiment of the compound semiconductor field effect transistor of the present invention.
Figure 12:
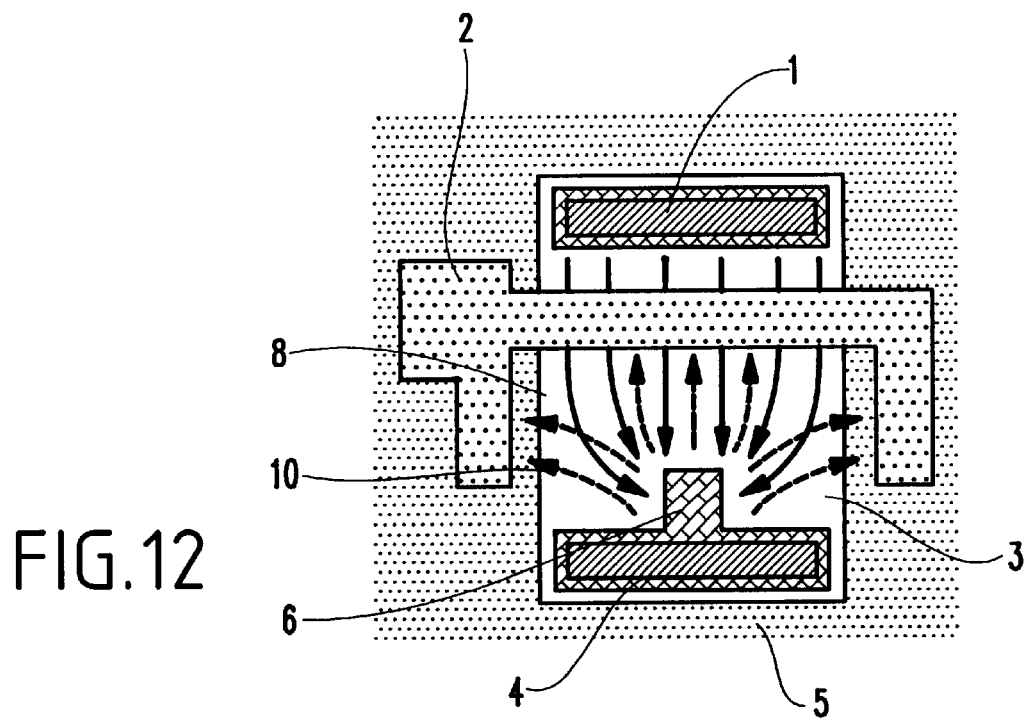
FIG. 12 is a drawing showing the operational principle of the seventh embodiment of the compound semiconductor field effect transistor of the present invention.

The present embodiment has a structure in which the holes generated in the channel can be carried to the channel end intentionally. As shown in FIG. 11, the highly doped n type region 6 of drain is projected into each channel (sub-channel) sandwiched between two isolation regions 7, at around the center of each sub-channel width so as to approach the gate 2. Thereby, as shown in FIG. 12, the flow 8 of electrons is directed toward the center of the channel and the flow 10 of holes is directed toward the channel end (side). In general, an electric current flows in the direction of electric field; therefore, it is considered that the flow of holes is opposite to the flow of electrons and gathers in the vicinity of the gate electrode. In high-voltage operation, however, electrons ballistically approach the drain in the state of a hot carrier and, therefore, the direction of electron flow does not agree with the gradient of potential. At the channel end portion, holes flow by diffusion owing to their concentration gradient, whereby there appears an effect of discharging the holes to the channel end.

In the above first to seventh embodiments, each isolation region through which a very weak hole flow must be passed, preferably has such a small width that the sub-channels formed at the both sides of the isolation region causes no short-circuiting, in view of the areal increase, parasitic resistance and parasitic capacity of FET.

The width of each sub-channel sandwiched between two isolation regions is preferably as small as possible in view of the breakdown voltage of FET, because the effect of the present invention is restricted to the channel end portion. Too small the width of each sub-channel results in an increased total width of transistor because the total channel width is determined by an intended current level. Since the channel width of one FET is ordinarily about 100 $\mu$m, the width of each sub-channel is appropriately 3 to 10 $\mu$m. The width of channel end portion (the width of area extending from the isolation region/channel interface toward the direction of channel width) which serves to attract holes can not be determined in a specific range because it is different depending upon the shape of non-gate region, the voltage used, the donor concentration of channel, i.e. the threshold of transistor, etc.

The above description was made for MESFET. The same effects as above hold as well for so-called HEMT type devices having a heteroepitaxial growth layer on the surface.

What is claimed is:

1. A compound semiconductor field effect transistor comprising:
   a gate electrode;
   a drain electrode;
   a channel region between said gate electrode and said drain electrode, having a non-gate region which is not covered by said gate electrode; and a plurality of isolation regions formed in said non-gate region and extending in a direction of channel current and contacting said gate electrode.

2. A compound semiconductor field effect transistor according to claim 1, wherein width of each sub-channel of the non-gate region increases gradually from the gate toward the drain.

3. The compound semiconductor field effect transistor according to claim 1, wherein said non-gate region further comprises sub-channels formed between said isolations regions, and wherein a width of each sub-channel decreases gradually from said gate electrode toward said drain electrode.

4. A compound semiconductor field effect transistor according to claim 1, wherein the gate electrode projects into each the isolation region.

5. A compound semiconductor field effect transistor according to claim 1, wherein the isolation regions are semi-insulating regions.

6. A compound semiconductor field effect transistor according to claim 1, wherein the isolation regions are p type regions.

7. A compound semiconductor field effect transistor according to claim 6, which has a p type layer below the channel and wherein portions of the surface layer to be converted into the isolation regions are removed by etching to expose surface of the p type layer and the exposed regions of the p type layer are used as the isolation regions.

8. A compound semiconductor field effect transistor according to claim 1, wherein highly doped n type region surrounding the drain electrode has projections extending into the channel at around center of each sub-channel width so as to approach the gate.

9. The compound semiconductor field effect transistor according to claim 1, wherein said isolation regions inhibit a flow of avalanche holes toward said gate electrode.

10. The compound semiconductor field effect transistor according to claim 1, wherein said isolation regions increase a breakdown voltage of said transistor.

11. The compound semiconductor field effect transistor according to claim 1, wherein isolation regions decrease a conductivity of said channel region.

12. The compound semiconductor field effect transistor according to claim 1, wherein said isolation regions cause avalanche holes to flow parallel to said gate electrode.

13. The compound semiconductor field effect transistor according to claim 3, wherein said isolation regions have a lower voltage than said subchannels.

14. The compound semiconductor field effect transistor according to claim 1, wherein a surface of said non-gate region has an electron-trapping type surface state.

15. The compound semiconductor field effect transistor according to claim 1, wherein an electric field concentration occurs at an end of each of said sub-channel closest to said gate electrode.

16. The compound semiconductor field effect transistor according to claim 3, wherein said channel region has a width of 100 $\mu$m and wherein said non-gate region comprises 20 sub-channels.

* * * * *